(12) United States Patent
Kagawa et al.

(10) Patent No.: US 9,825,164 B2
(45) Date of Patent: Nov. 21, 2017

(54) SILICON CARBIDE SEMICONDUCTOR DEVICE AND MANUFACTURING METHOD FOR SAME

(71) Applicant: MITSUBISHI ELECTRIC CORPORATION, Chiyoda-ku (JP)

(72) Inventors: Yasuhiro Kagawa, Tokyo (JP); Rina Tanaka, Tokyo (JP); Yutaka Fukui, Tokyo (JP); Kohei Ebihara, Tokyo (JP); Shiro Hino, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/909,407

(22) PCT Filed: Jul. 31, 2014

(86) PCT No.: PCT/JP2014/004026
§ 371 (c)(1),
(2) Date: Feb. 1, 2016

(87) PCT Pub. No.: WO2015/015808
PCT Pub. Date: Feb. 5, 2015

(65) Prior Publication Data
US 2016/0190307 A1 Jun. 30, 2016

(30) Foreign Application Priority Data
Aug. 1, 2013 (JP) .................................. 2013-160610

(51) Int. Cl.
*H01L 29/66* (2006.01)
*H01L 29/15* (2006.01)
(Continued)

(52) U.S. Cl.
CPC ...... *H01L 29/7811* (2013.01); *H01L 29/0615* (2013.01); *H01L 29/0623* (2013.01);
(Continued)

(58) Field of Classification Search
CPC ............. H01L 29/7811; H01L 29/7813; H01L 29/66734; H01L 29/0623
(Continued)

(56) References Cited

U.S. PATENT DOCUMENTS 6,825,537 B2    11/2004   Iwamoto et al.
7,087,958 B2 *   8/2006   Chuang ................. H01L 29/402
                                                             257/328

(Continued)

FOREIGN PATENT DOCUMENTS

JP   2001-267570 A   9/2001
JP   2002-185015 A   6/2002
(Continued)

OTHER PUBLICATIONS

Japanese Office Action dated Jun. 14, 2016 in Japanese Application No. 2015-529396 (with Partial English Translation).
(Continued)

*Primary Examiner* — Steven Loke
*Assistant Examiner* — Brandon Fox
(74) *Attorney, Agent, or Firm* — Oblon, McClelland, Maier & Neustadt, L.L.P.

(57) ABSTRACT

A silicon carbide semiconductor device includes a drift layer of a first conductivity type, a source region of the first conductivity type, an active trench formed in penetration through the source region, a base region, a termination trench formed around the active trench, a gate insulating film formed on a bottom surface, a side surface of the active trench, a gate electrode embedded and formed in the active trench with the gate insulating film interposed therebetween, a protective diffusion layer of a second conductivity type formed in a lower portion of the active trench and a part of a lower portion of the termination trench and having a first impurity concentration, and a termination diffusion layer of (Continued)

the second conductivity type formed on an outside of the protective diffusion layer in the lower portion of the termination trench and having a second impurity concentration lower than the first impurity concentration.

8 Claims, 6 Drawing Sheets

(51) Int. Cl.
```
H01L 29/78       (2006.01)
H01L 29/16       (2006.01)
H01L 29/06       (2006.01)
H01L 29/10       (2006.01)
H01L 29/423      (2006.01)
H01L 21/04       (2006.01)
```
(52) U.S. Cl.
CPC ...... *H01L 29/0661* (2013.01); *H01L 29/1095* (2013.01); *H01L 29/1608* (2013.01); *H01L 29/66068* (2013.01); *H01L 29/66734* (2013.01); *H01L 29/7813* (2013.01); *H01L 21/0465* (2013.01); *H01L 29/4238* (2013.01)

(58) Field of Classification Search
USPC .................................................. 257/77, 330
See application file for complete search history.

(56) References Cited

U.S. PATENT DOCUMENTS

| | | | |
|---|---|---|---|
| 7,741,676 B2 * | 6/2010 | Hashimoto | ....... H01L 29/66727 257/330 |
| 7,999,312 B2 | 8/2011 | Takaya et al. | |
| 8,193,564 B2 | 6/2012 | Suzuki et al. | |
| 8,686,438 B2 | 4/2014 | Hiyoshi et al. | |
| 2005/0029557 A1 * | 2/2005 | Hatakeyama | ....... H01L 29/0615 257/263 |
| 2013/0099251 A1 * | 4/2013 | Hiyoshi | ............ H01L 29/66068 257/77 |
| 2013/0285140 A1 * | 10/2013 | Kagawa | .............. H01L 29/7811 257/330 |
| 2014/0353748 A1 * | 12/2014 | Ma | ...................... H01L 29/0634 257/334 |
| 2015/0214353 A1 * | 7/2015 | Yamada | ............ H01L 29/66068 257/77 |

FOREIGN PATENT DOCUMENTS

| | | | | |
|---|---|---|---|---|
| JP | 2004-134597 A | 4/2004 | | |
| JP | 2007-242852 A | 9/2007 | | |
| JP | 2010-062360 A | 3/2010 | | |
| JP | 2010-109221 A | 5/2010 | | |
| JP | 2010-147222 A | 7/2010 | | |
| JP | 2013-69783 A | 4/2013 | | |
| JP | WO 2014065015 A1 * | 5/2014 | ....... H01L 29/66068 |
| WO | WO 02/49114 A2 | 6/2002 | | |
| WO | 2006/082618 A1 | 8/2006 | | |
| WO | 2012/077617 A1 | 6/2012 | | |
| WO | 2013/058037 A1 | 4/2013 | | |

OTHER PUBLICATIONS

International Search Report dated Oct. 7, 2014 for PCT/JP2014/004026 filed on Jul. 31, 2014.

International Preliminary Report on Patentability and Written Opinion dated Feb. 2, 2016 in PCT/JP2014/004026 filed Jul. 31, 2014 (with English language translation).

* cited by examiner

SILICON CARBIDE SEMICONDUCTOR DEVICE AND MANUFACTURING METHOD FOR SAME

TECHNICAL FIELD

The present invention relates to a silicon carbide semiconductor device and a method for manufacturing the same, and more particularly to a trench gate type silicon carbide semiconductor device and a method for manufacturing the same.

BACKGROUND ART

In power electronics equipment, there is widely used a switching element referred to as an insulated gate type semiconductor device such as an IGBT (Insulated Gate Bipolar Transistor) or an MOSFET (Metal Oxide Semiconductor Field Effect Transistor) in order to control supply of power to a load such as an electric motor. Some insulated gate type semiconductor devices include a trench gate type semiconductor device having a gate electrode embedded in a semiconductor layer. On the other hand, attention is paid to a semiconductor device using silicon carbide (SiC) (hereinafter such a device will be referred to as a "silicon carbide semiconductor device") as a next generation semiconductor device capable of realizing a high withstand voltage and a low loss, and development of a trench gate type silicon carbide semiconductor device is also advanced.

Referring to a trench gate type semiconductor device using silicon (Si), an avalanche electric field strength of a semiconductor layer is lower than a dielectric breakdown electric field strength of a gate insulating film. For this reason, a withstand voltage of the semiconductor device is determined by the avalanche electric field strength of the semiconductor layer. On the other hand, the avalanche electric field strength of SiC is approximately 10 times as great as Si. Referring to the silicon carbide semiconductor device, therefore, the avalanche electric field strength of the semiconductor layer (SiC) is equivalent to the dielectric breakdown electric field strength of the gate insulating film. In the trench gate type semiconductor device, when a voltage is applied to the semiconductor device, an electric field concentration occurs in a corner part of a lower portion of a trench. Therefore, a dielectric breakdown occurs earlier over a gate insulating film in a corner part of a trench in the silicon carbide semiconductor device. For this reason, in the trench gate type silicon carbide semiconductor device, a withstand voltage is limited by the electric field strength of the gate insulating film.

Therefore, it is proposed that a protective diffusion layer having a p-type impurities implanted at a high concentration is provided on a drift layer in a lower portion of a trench in a case of an n-channel type in a conventional trench gate type silicon carbide semiconductor device (for example, Patent Document 1). In the conventional trench gate type semiconductor device, moreover, it is known that a plurality of trenches is provided and a protective diffusion layer is provided in a lower portion of each of the trenches as described in Patent Document 2. By providing the protective diffusion layer in the lower portion of the trench, thus, it is possible to relax an electric field concentration in a corner part of the trench and to enhance a withstand voltage.

2

PRIOR ART DOCUMENTS

Patent Documents

Patent Document 1: Japanese Patent Application Laid-Open No. 2001-267570
Patent Document 2: Japanese Patent Application Laid-Open No. 2007-242852

SUMMARY OF INVENTION

Problems to be Solved by the Invention

As described above, in the case where the protective diffusion layer is provided in the lower portion of the trench, it is necessary to gradually increase an impurity concentration of the protective diffusion layer in order to sufficiently relax the electric field concentration in the corner part of the trench. When the impurity concentration of the protective diffusion layer is gradually increased, however, an electric field occurring in a PN junction portion of the protective diffusion layer and the drift layer is increased. As a result, the protective diffusion layer is broken due to an avalanche breakdown earlier than the breakdown of the gate insulating film in the corner part of the trench. Consequently, there is a fear that the withstand voltage of the semiconductor device might be limited by a voltage (hereinafter referred to as an "avalanche voltage") in which the avalanche breakdown occurs in the protective diffusion layer.

In the case where the plurality of trenches is provided and the protective diffusion layer is provided in the lower portion of each of the trenches, moreover, an electric field generated on the protective diffusion layer is relaxed by adjacent protective diffusion layers. However, an outermost peripheral protective diffusion layer out of the plurality of protective diffusion layers has the adjacent protective diffusion layer provided on only one side. Therefore, an electric field in the outermost peripheral protective diffusion layer is increased most greatly. As a result, the avalanche breakdown occurs earlier in the outermost peripheral protective diffusion layer. Consequently, there is a fear that the withstand voltage might be limited by the avalanche voltage on the outermost peripheral protective diffusion layer. As described above, there is a fear that the withstand voltage might be limited by the avalanche voltage of the protective diffusion layer in the conventional trench gate type silicon carbide semiconductor device.

The present invention has been made to solve the problems described above and an object thereof is to provide a silicon carbide semiconductor device capable of relaxing an electric field in a protective diffusion layer formed in a lower portion of a trench, thereby enhancing a withstand voltage.

Means for Solving the Problems

A silicon carbide semiconductor device according to the present invention includes a drift layer of a first conductivity type formed in an active region and a termination region being a surrounding region of the active region, a base region of a second conductivity type formed on an upper portion of the drift layer in the active region, a source region of the first conductivity type formed on an upper portion in the base region, an active trench formed in penetration through the source region and the base region in the active region, a termination trench formed to surround the active trench in the drift layer of the termination region, a gate insulating film formed on a bottom surface and a side surface of the active trench, a gate electrode formed in the trench with the gate insulating film interposed therebetween, a protective diffusion layer of the second conductivity type formed in a lower portion of the active trench and a part of a lower portion of the termination trench and having a concentration of impurities of the second conductivity type which is a first impurity concentration, and a termination diffusion layer of the second conductivity type formed on an outside of the protective diffusion layer in the lower portion of the termination trench and having a concentration of impurities of the second conductivity type which is a second impurity concentration lower than the first impurity concentration.

Effects of the Invention

According to the silicon carbide semiconductor device in accordance with the present invention, the termination trench is formed in the termination region being the surrounding region of the active region, and the termination diffusion layer is formed in the lower portion of the termination trench. Therefore, the termination diffusion layer is present around the protective diffusion layer formed in the lower portion of the trench in the active region. As a result, it is possible to relax an electric field in the protective diffusion layer by extension of a depletion layer from the termination diffusion layer. Moreover, the second impurity concentration to be the impurity concentration of the second conductivity type in the termination diffusion layer is lower than the first impurity concentration to be the impurity concentration of the second conductivity type in the protective diffusion layer. Therefore, an electric field generated in the termination diffusion layer itself is also reduced more greatly than the electric field in the protective diffusion layer, and an avalanche breakdown in the termination diffusion layer is also suppressed. Accordingly, it is possible to relax the electric field in the protective diffusion layer and to also suppress the avalanche breakdown in the termination diffusion layer. Therefore, it is possible to enhance a withstand voltage of the silicon carbide semiconductor device.

DESCRIPTION OF EMBODIMENTS

First Embodiment

Figure 1:
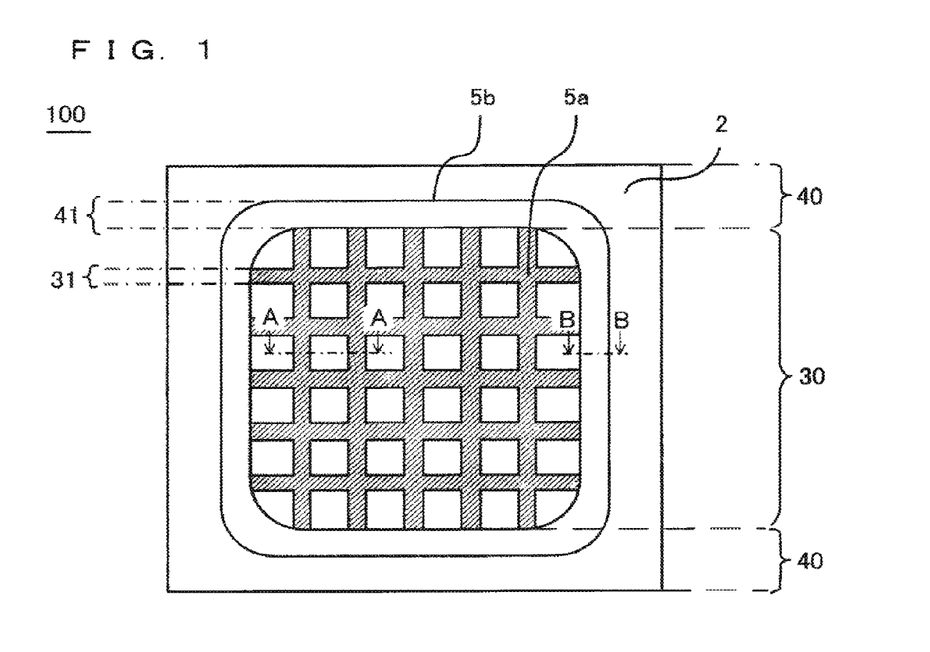
FIG. 1 is a plan view showing a silicon carbide semiconductor device according to a first embodiment of the present invention.

First of all, a structure of a silicon carbide semiconductor device 100 according to a first embodiment will be described with reference to FIGS. 1 to 3. FIG. 1 is a plan view showing the silicon carbide semiconductor device 100 according to the first embodiment. In FIG. 1, there are not shown a gate insulating film 5, a gate electrode 7, an interlayer insulating film 8, and a source electrode 9 to be formed on a semiconductor layer 2 and in a trench. Therefore, FIG. 1 shows the semiconductor layer 2 having a trench 5a and a termination trench 5b formed thereon.

Note that, in the following description, it is assumed that an "active region" indicates a region in which a current flows by formation of a channel in an ON state of a semiconductor device and a "termination region" indicates a region provided around the active region. Moreover, it is assumed that an "impurity concentration" indicates a peak value of an impurity concentration in each region. In the following description, furthermore, an "outer peripheral side" indicates a direction from an inside of the silicon carbide semiconductor device 100 toward an outside of the silicon carbide semiconductor device 100 in a plan view of the silicon carbide semiconductor device 100 (a planar direction) shown in FIG. 1, and an "inner peripheral side" indicates an opposite direction to the "outer peripheral side". Accordingly, a direction from right toward left indicates the outer peripheral side and a direction from left toward right indicates the inner peripheral side as illustrated in FIG. 3.

The silicon carbide semiconductor device 100 according to the first embodiment is a trench gate type MOSFET. In FIG. 1, the semiconductor layer 2 of the silicon carbide semiconductor device 100 has the trench 5a formed in an active region 30 and has the termination trench 5b formed around the trench 5a in a termination region 40. As shown in FIG. 1, moreover, the trench 5a is provided like a grid in the planar direction. A plurality of blocks (cells) divided by the trench 5a function as MOSFETs, respectively. Although the cell is formed to be provided in a divided shape of a grid in the present embodiment, a cell arrangement may take another configuration in which the cell is disposed in a shape of a comb or zigzag. In FIG. 1, moreover, a width 41 of the termination trench 5b is greater than each width 31 of the active trench 5a provided like a grid. The details of the silicon carbide semiconductor device 100 will be described below.

Figure 2:
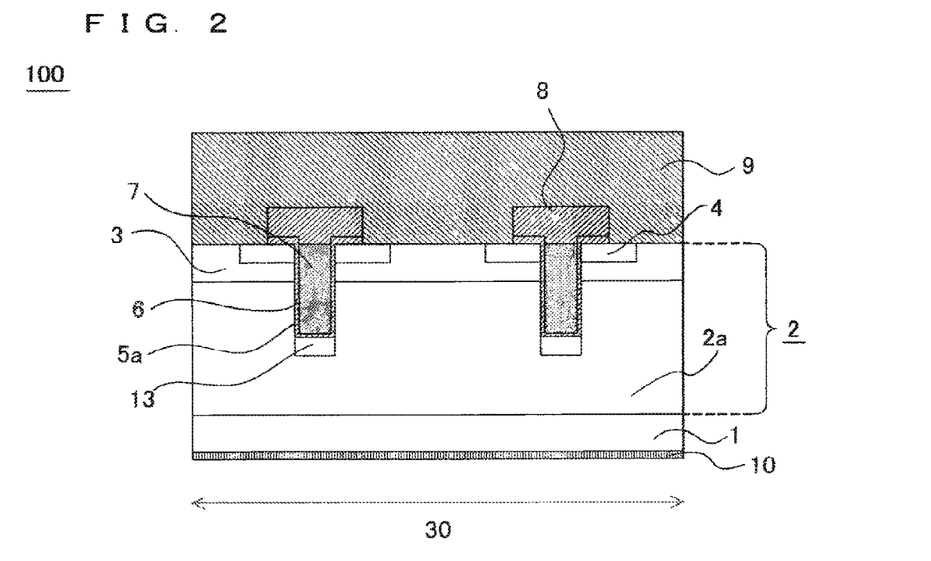
FIGS. 2 and 3 are sectional views showing the silicon carbide semiconductor device according to the first embodiment of the present invention.

With reference to FIG. 2, description will be given of the structure of the silicon carbide semiconductor device 100 in the active region 30. FIG. 2 is an A-A sectional view in FIG. 1 and is a sectional view in the active region 30 of the silicon carbide semiconductor device 100 according to the first embodiment.

In FIG. 2, the silicon carbide semiconductor device 100 includes, in the active region 30, an n-type silicon carbide substrate 1, the semiconductor layer 2 formed on an upper surface of the silicon carbide substrate 1, the interlayer insulating film 8 and the source electrode 9 formed on the semiconductor layer 2, and a drain electrode 10 formed on a back surface side of the silicon carbide substrate 1. The semiconductor layer 2 is formed of an n-type epitaxial growth layer which is epitaxially grown on the silicon carbide substrate 1, a p-type base region 3 is formed on the upper portion in the semiconductor layer 2, and an -type source region 4 is formed on an upper portion in the base region 3. Moreover, an n-type region of the semiconductor layer 2 having no base region 3 formed thereon serves as a drift layer 2a. Note that, the semiconductor layer 2 is a general term collecting the drift layer 2a, the base region 3, and the source region 4.

Herein, it is assumed that an n-type impurity concentration in the drift layer 2a is $1.0E15$ cm$^{-3}$ to $1.0E17$ cm$^{-3}$, a p-type impurity concentration in the base region 3 is $1.0E17$ cm$^{-3}$ to $1.0E18$ cm$^{-3}$, and an n-type impurity concentration in the source region 4 is $1.0E18$ cm$^{-3}$ to $1.0E21$ cm$^{-3}$.

In FIG. 2, the trench 5a reaching the drift layer 2a in penetration through the source region 4 and the base region 3 is formed on the semiconductor layer 2 in the active region 30. A gate insulating film 6 is provided on a side surface and a bottom surface of the trench 5a. Furthermore, the gate electrode 7 is embedded in the trench 5a with the gate insulating film 6 interposed therebetween. Moreover, a p-type protective diffusion layer 13 having a p-type impurity concentration which is a first impurity concentration is formed on the drift layer 2a in a lower portion of the trench 5a. Note that, the first impurity concentration will be described later.

In FIG. 2, the interlayer insulating film 8 is formed on an upper surface of the semiconductor layer 2 in order to cover the gate electrode 7. A contact hole reaching the source region 4 and the base region 3 on an upper surface of the semiconductor layer 2 is formed on the interlayer insulating film 8. The source electrode 9 is formed on the interlayer insulating film 8, and the source electrode 9 is connected to the source region 4 and the base region 3 via the contact hole of the interlayer insulating film 8.

Figure 3:
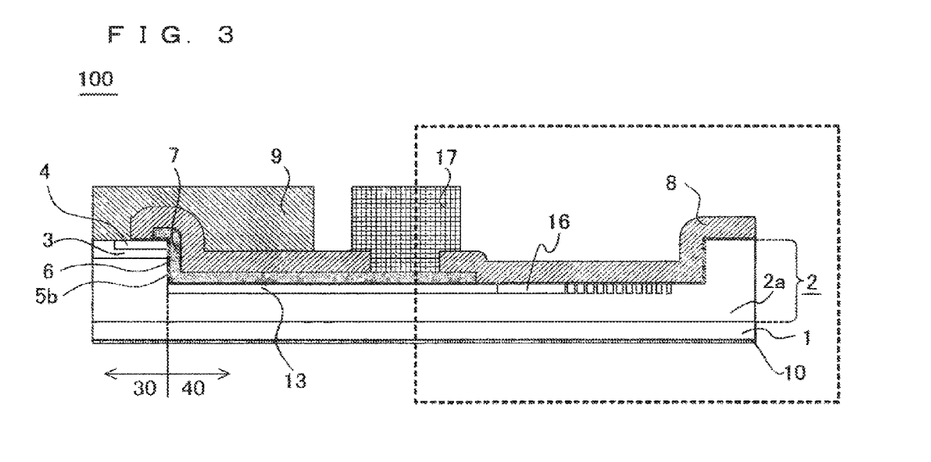

With reference to FIG. 3, next, description will be given of the structure of the silicon carbide semiconductor device 100 in a boundary part between the active region 30 and the termination region 40, and in the termination region 40. FIG. 3 is a B-B sectional view in FIG. 1, and is a sectional view in the boundary part between the active region 30 and the termination region 40, and in the termination region 40 in the silicon carbide semiconductor device 100 according to the first embodiment.

As shown in FIG. 3, also in the termination region 40, the semiconductor layer 2 (the drift layer 2a) is formed on the upper surface side of the silicon carbide substrate 1 and the drain electrode 10 is formed on the back surface side of the silicon carbide substrate 1. In FIG. 3, the base region 3 is formed on the upper portion in the semiconductor layer 2 of the active region 30, the source region 4 is formed on the upper portion in the base region 3, and the source region 4 in FIG. 3 serves as the outermost peripheral source region 4 in the active region 30.

The termination trench 5b is formed on the semiconductor layer 2 (the drift layer 2a) at the outer peripheral side of the outermost peripheral source region 4. Although the termination trench 5b is formed in the termination region 40, it is not formed at an end in the planar direction of the semiconductor layer 2. Moreover, the termination trench 5b is formed to surround the active region 30 of the silicon carbide semiconductor device 100 as shown in FIG. 1. Note that, in FIG. 3, the outer peripheral side of the region where the termination trench 5b is formed serves as the termination region 40, and the inner peripheral side of the region where the termination trench 5b is formed serves as the active region 30.

In FIG. 3, a protective diffusion layer 13 is formed on the inner peripheral side and a termination diffusion layer 16 is formed on the outer peripheral side in the lower portion of the termination trench 5b. The protective diffusion layer 13 formed in the lower portion of the termination trench 5b is linked to the protective diffusion layer 13 formed on the lower portion of the trench 5a in the active region 30.

Moreover, the protective diffusion layer 13 formed on the lower portion of the termination trench 5b is extended to the end on the inner peripheral side in the lower portion of the termination trench 5b. On the other hand, the termination diffusion layer 16 is a p-type semiconductor layer having a p-type impurity-concentration which is a second impurity concentration and the second impurity concentration will be described later. Moreover, the termination diffusion layer 16 is extended toward the end in the planar direction of the semiconductor layer 2 at the outer peripheral side of the protective diffusion layer 13, and is formed by being divided into a plurality of small regions at the outer peripheral side of the semiconductor layer 2.

In FIG. 3, moreover, the gate insulating film 6 is formed on the side surface and the bottom surface of the termination trench 5b, and the gate electrode 7 is formed on a part at the active region 30 side on the gate insulating film 6 in the termination trench 5b. The gate electrode 7 is provided to get on the source region 4 at the outermost periphery of the active region 30 from the inner part of the termination trench 5b on the protective diffusion layer 13. In FIG. 3, furthermore, the interlayer insulating film 8 is extended from the end in the planar direction of the semiconductor layer 2 toward the active region 30 on the gate insulating film 6 and the gate electrode 7. Moreover, a contact hole is formed in the interlayer insulating film 8 on the gate electrode 7, and a gate pad 17 is connected to the gate electrode 7 via, the contact hole of the interlayer insulating film 8. A position in which the gate pad 17 is connected to the gate electrode 7 is set onto the protective diffusion layer 13 formed in the lower portion of the termination trench 5b.

It is preferable that the first impurity concentration serving as the p-type impurity concentration of the protective diffusion layer 13 should be set to be an impurity concentration in which the protective diffusion layer 13 is not completely depleted when a rated voltage of the silicon carbide semiconductor device 100 is applied between the drain electrode 10 and the source electrode 9. More specifically, it is preferable that the first impurity concentration should be equal to or higher than $5.0E17$ cm$^{-3}$ and be equal to or lower than $5.0E18$ cm$^{-3}$. On the other hand, the second impurity concentration to be the p-type impurity concentration of the termination diffusion layer 16 is set to be an impurity concentration which is lower than the first impurity concentration to be the p-type impurity concentration of the protective diffusion layer 13. More specifically, it is preferable that the second impurity concentration should be equal to or higher than $1.0E17$ m$^{-3}$, be equal to or lower than $1.0E18$ cm$^{-3}$, and be lower than the first impurity concentration.

Next, description will be given of an operation of the silicon carbide semiconductor device 100 according to the present embodiment. When a voltage which is equal to or higher than a threshold voltage is applied to the gate electrode 7 of the silicon carbide semiconductor device 100, a channel is formed in a region of the base region 3 which is opposed to the gate electrode 7 in the active region 30. Consequently, there is formed a path along which an electron to be a carrier flows between the n-type source region 4 and the n-type drift layer 2a. The electron flowing from the source region 4 into the drift layer 2a reaches the drain electrode 10 via the drift layer 2a and the silicon carbide substrate 1 in accordance with an electric field formed by a voltage (a drain voltage) applied between the drain electrode 10 and the source electrode 9. As a result, the voltage which is equal to or higher than the threshold voltage is applied to the gate electrode 7 so that a current flows from the drain electrode 10 to the source electrode 9 and this state is brought into an ON state of the silicon carbide semiconductor device 100.

On the other hand, in a state where a voltage which is equal to or lower than the threshold voltage is applied to the gate electrode 7, the channel is not formed in the base region 3 so that the p-type base region 3 is present between the n-type source region 4 and the n-type drift layer 2a. For this reason, there is not formed the path along which the electron to be the carrier flows, and a current from the drain electrode 10 toward the source electrode 9 does not flow. This state brought into an OFF state of the silicon carbide semiconductor device 100.

With reference to FIGS. 4 to 12, subsequently, description will be given of a method for manufacturing a silicon carbide semiconductor device according to the first embodiment. FIGS. 4 to 12 are views each showing manufacturing steps in the method for manufacturing the silicon carbide semiconductor device according to the first embodiment. In each of the figures, part (A) is a sectional view corresponding to an A-A section in FIG. 1 and part (B) is a sectional view corresponding to a B-B section in FIG. 1. Note that, part (B) in each of FIGS. 4 to 12 illustrates a region surrounded by a broken line of FIG. 3. In the following description, moreover, it is assumed that the steps in both parts (A) and (B) are described in each figure unless otherwise noted.

Figure 4:
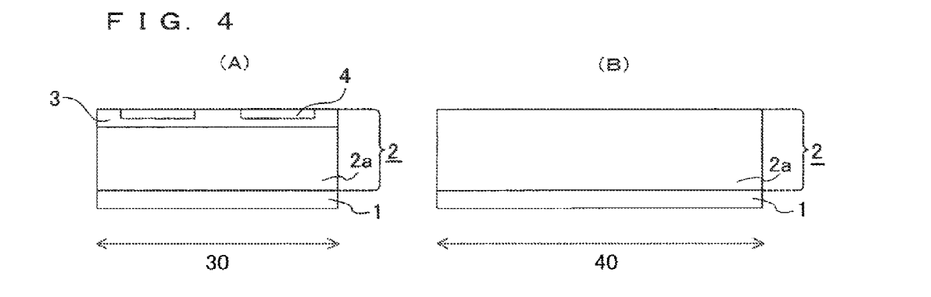
FIGS. 4 to 12 are sectional views showing manufacturing steps of a method for manufacturing the silicon carbide semiconductor device according to the first embodiment of the present invention.

First of all, in FIG. 4, there is prepared the n-type silicon carbide substrate 1 having a first main surface (an upper surface) and a second main surface (a back surface) opposite to each other and having a 4H polytype. In the active region 30 and the termination region 40, then, the n-type semiconductor layer 2 is epitaxially grown on the upper, surface of the silicon carbide substrate 1 by the Chemical Vapor Deposition (CVD) method. Moreover, a thickness of the semiconductor layer 2 is set to be 5 to 50 μm and the n-type impurity concentration of the semiconductor layer 2 is, set to be $1.0E15$ cm$^{-3}$ to $1.0E17$ cm$^{-3}$.

Then, as shown in part (A) of FIG. 4, in the active region 30, Al ions are implanted as p-type impurities into the upper surface of the semiconductor layer 2 through an implantation mask which is not shown so as to form the base region 3 on the upper portion in the semiconductor layer 2. An implantation depth of the Al ions is set to be smaller than the thickness of the semiconductor layer 2, for example, approximately 0.5 to 3.0 μm. Moreover, an ion implantation amount causes the p-type impurity concentration of the base region 3 to be $1.0E17$ cm$^{-3}$ to $1.0E18$ cm$^{-3}$ which is higher than the n-type impurity concentration of the semiconductor layer 2. Consequently, a region of the semiconductor layer 2 in which the Al ions are implanted serves as the p-type base region 3, and a region of the semiconductor layer 2 in which the Al ions are not implanted serves as the n-type drift layer 2a. The base region 3 may be formed by the epitaxial growth. Also in such a case, the impurity concentration and the thickness are equivalent to those in the case where the formation is performed by ion implantation. Moreover, the p-type impurities to be implanted into the base region 3 may be different p-type impurities such as B other than Al, and the case of the implantation of the p-type impurities is also the same in the following description.

Thereafter, N ions are implanted as the n-type impurities into the upper surface of the semiconductor layer 2 through an implantation mask which is not shown so as to form the source region 4 on a part of the upper portion in the base region 3. It is assumed that an implantation depth of the N ions is smaller than the thickness of the base region 3.

Moreover, an n-type impurity concentration in the source region 4 ranges from $1.0E18$ cm$^{-3}$ to $1.0E21$ cm$^{-3}$ and is equal to or higher than the p-type impurity concentration in the base region 3. Moreover, the n-type impurities to be implanted into the source region 4 may be different n-type impurities other than N.

Figure 5:
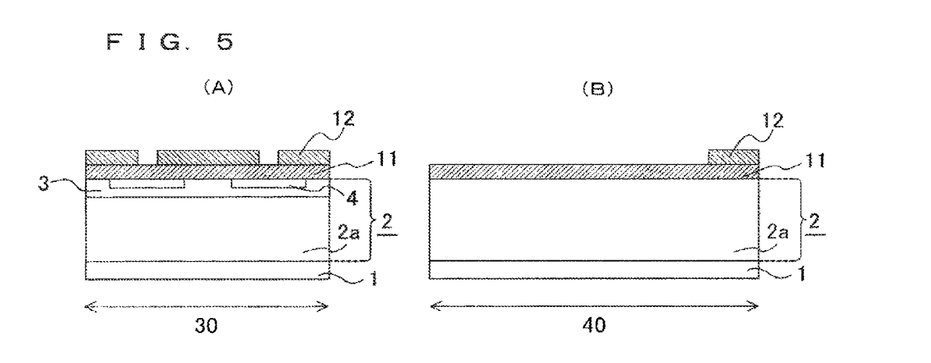
Figure 6:
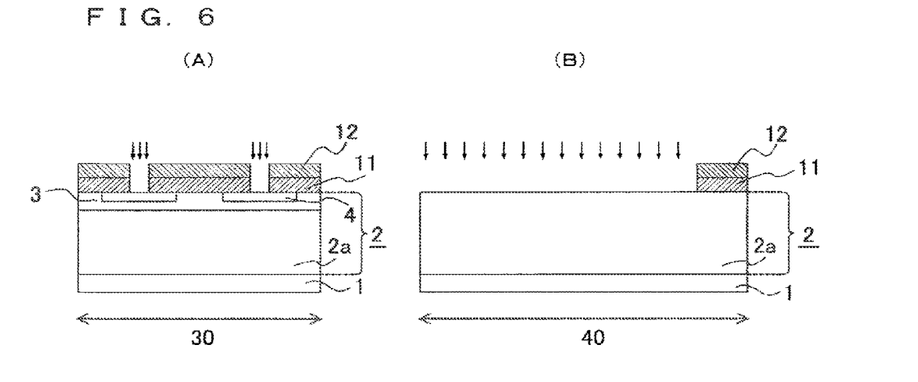

In FIG. 5, next, a silicon oxide layer 11 is deposited in a thickness of approximately 1.0 to 2.0 μm on the upper surface of the semiconductor layer 2. Then, an etching mask 12 formed of a resist material is formed on an upper surface of the silicon oxide layer 11. An opening is formed on the etching mask 12 in portions where the trench 5a and the termination trench 5b to be described below are formed. In FIG. 6, then, the silicon oxide layer 11 is etched by a reactive ion etching (RIE) treatment in a state where the etching mask 12 is formed on the upper surface. Consequently, an opening is formed on the silicon oxide layer 11, and the silicon oxide layer 11 having the opening formed thereon serves as an etching mask in a next step.

Figure 7:
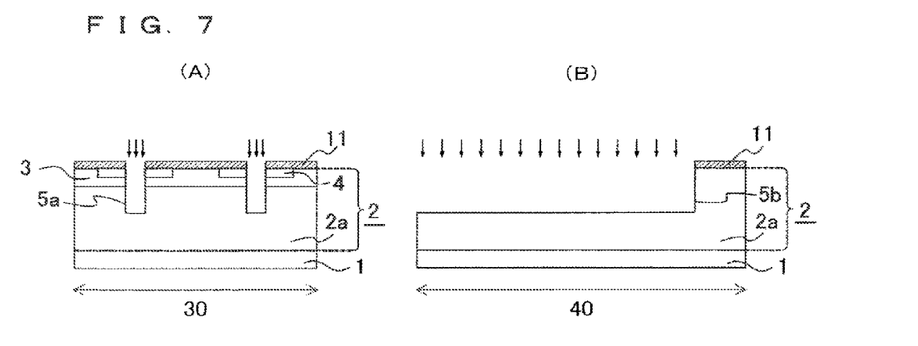

In FIG. 7, subsequently, the RIE is performed by using the silicon oxide layer 11 as an etching mask to etch the semiconductor layer 2. Thus, the trench 5a and the termination trench 5b are formed. Consequently, the trench 5a penetrating the base region 3 from the source region 4 is formed in the active region 30 as shown in part (A) of FIG. 7, and the termination trench 5b is formed on the drift layer 2a in the termination region 40 as shown in part (B) of FIG. 7. Moreover, the termination trench 5b is formed around the trench 5a so as to surround the trench 5a as shown in FIG. 1. Depths of the trench 5a and the termination trench 5b are set to be approximately 0.5 to 3.0 μm and the depth of the trench 5a is set to be equal to or greater than the depth of the base region 3.

Figure 8:
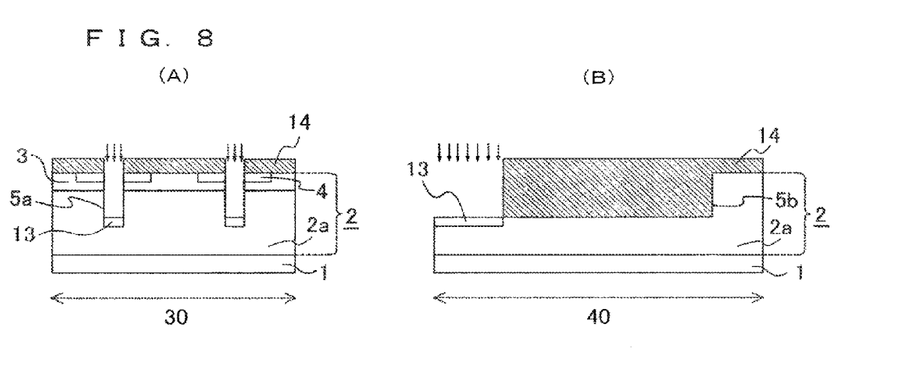

In FIG. 8, next, after the removal of the silicon oxide layer 11, an implantation mask 14 is formed on the semiconductor layer 2 and Al ions are implanted as the p-type impurities. The implantation mask 14 is formed to cover a region other than the trench 5a in part (A) of FIG. 8, and to cover a region other than a part of the termination trench 5b at the active region 30 side in part (B) of FIG. 8. Consequently, a protective diffusion layer 13 is formed on the drift layer 2a in the lower portion of the trench 5a and at the inner peripheral side of the lower portion of the termination trench 5b corresponding to the opening of the implantation mask 14. An ion implantation amount for implantation into the protective diffusion layer 13 will be described later.

In order to form the protective diffusion layer 13 in the lower portion of the trench 5a, a residual film of the silicon oxide layer 11 used for etching the trench 5a may be utilized and the implantation mask 14 may be used in only the formation of the protective diffusion layer 13 in the lower portion of the termination trench 5b. In such a case, by regulating the etching conditions or the thickness of the silicon oxide layer 11, it is necessary to perform the ion implantation in such a manner that the silicon oxide layer 11 remains also after the ion implantation. Consequently, alignment accuracy of the implantation mask 14 with the trench 5a of the active region 30 is not required so that the protective diffusion layer 13 can be formed with higher accuracy.

Figure 9:
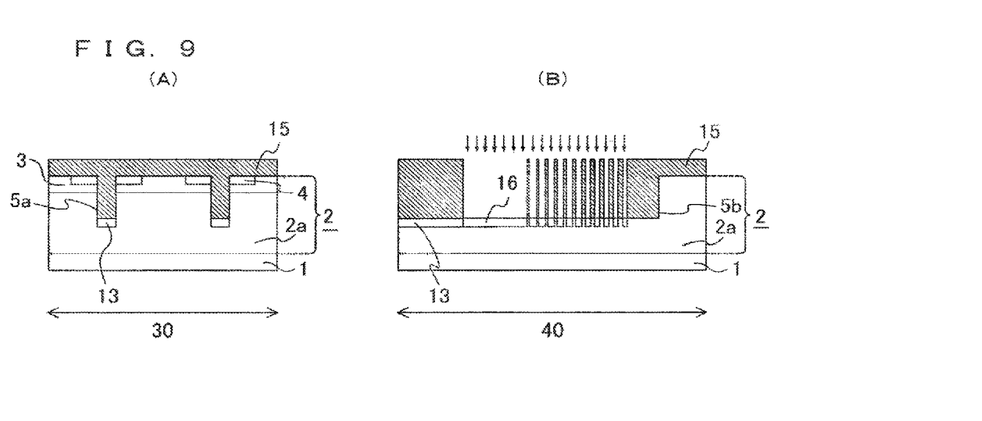

Subsequently, after the removal of the implantation mask 14, in FIG. 9, an implantation mask 15 is formed newly on the semiconductor layer 2 and Al ions are implanted as the p-type impurities. The implantation mask 15 is formed to cover the entire upper surface of the semiconductor layer 2 in part (A) of FIG. 9 and is formed such that an opening is located on the outer peripheral side of the protective diffusion layer 13 in the lower portion of the termination trench 5b in part (B) of FIG. 9. In part (B) of FIG. 9, moreover, a plurality of openings is formed on the implantation mask 15 and the opening on the active region 30 side has a greater opening width than the other openings.

Then, ion implantation is performed by using the implantation mask 15 so that a termination diffusion layer 16 is formed on the drift layer 2a in the lower portion of the termination trench 5b corresponding to the opening of the implantation mask 15. An ion implantation amount for implantation into the termination diffusion layer 16 will be described later. Although the termination diffusion layer 16 is formed after the protective diffusion layer 13 is formed in the present embodiment, the protective diffusion layer 13 may be formed after the termination diffusion layer 16 is formed.

It is preferable that the implantation should be performed in such an ion implantation amount for the implantation into the protective diffusion layer 13 that a first impurity concentration to be a p-type impurity concentration of the protective diffusion layer 13 is set to be an impurity concentration causing no complete depletion of the protective diffusion layer 13 when the rated voltage of the silicon carbide semiconductor device 100 is applied between the drain electrode 10 and the source electrode 9. More specifically, it is preferable to perform the implantation in such a manner that the implantation concentration is equal to or higher than $5.0E17$ cm$^{-3}$ and is equal to or lower than $5.0E18$ cm$^{-3}$. On the other hand, the implantation is performed in such an ion implantation amount for the implantation into the termination diffusion layer 16 that a second impurity concentration to be the p-type impurity concentration of the termination diffusion layer 16 is set to be an impurity concentration which is lower than the p-type impurity concentration of the protective diffusion layer 13. More specifically, it is preferable to perform the implantation in such a manner that the implantation concentration is equal to or higher than $1.0E17$ cm$^{-3}$ and is equal to or lower than $1.0E18$ cm$^{-3}$, and is set to be an impurity concentration which is lower than the first impurity concentration.

Then, after the removal of the implantation mask 15, an annealing treatment is performed by a heat treatment device. The annealing treatment is performed at 1300 to 1900° C. for 30 seconds to one hour in an inert gas atmosphere of an argon (Ar) gas or the like. Consequently, impurities of N and Al implanted as ions are activated.

Figure 10:
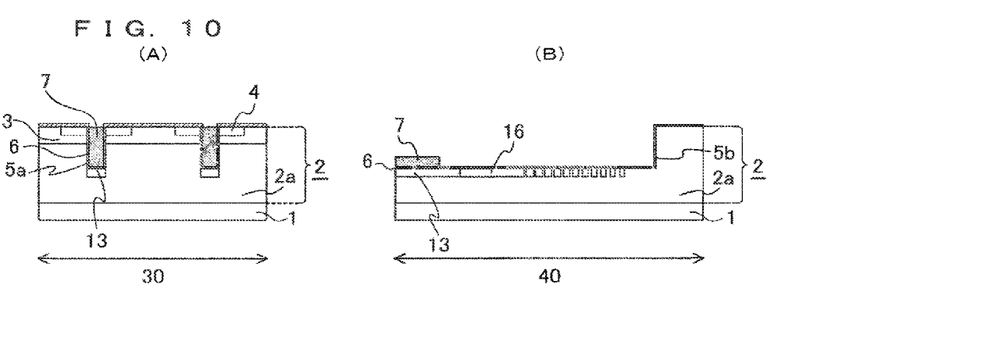

In FIG. 10, next, the gate insulating film 6 formed of silicon oxide is formed on the upper surface of the semiconductor layer 2 including the source region 4 and the base region 3 and the bottom surfaces and side surfaces (inside walls) of the trench 5a and the termination trench 5b. The gate insulating film 6 can be formed by thermal oxidation of the semiconductor layer 2 or deposition of a silicon oxide layer on the upper portion of the semiconductor layer 2. Then, the gate electrode 7 is formed in the trench 5a and the termination trench 5b. It is possible to form the gate electrode 7 by forming a polycrystalline silicon film having conductivity by a low pressure CVD method and patterning the polycrystalline silicon film. Herein, the gate electrode 7 is embedded in the trench 5a with the gate insulating film 6 interposed therebetween and is thus formed as shown in part (A) of FIG. 10, and the gate electrode 7 is formed on the gate insulating film 6 at the active region 30 side of the upper portion of the protective diffusion layer 13 in the termination trench 5b as shown in part (B) of FIG. 10.

Figure 11:
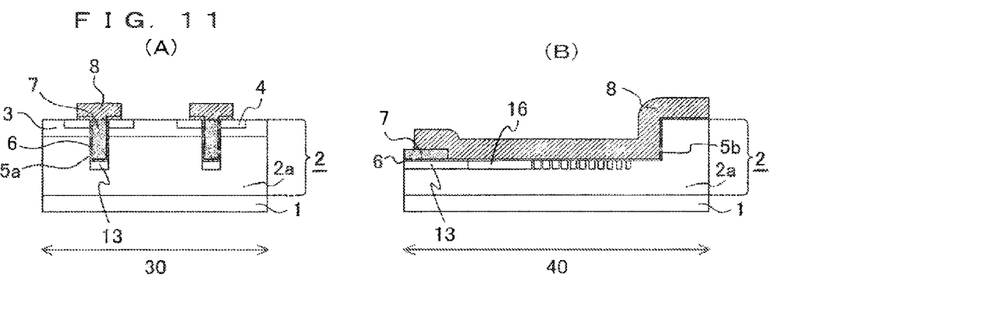

In FIG. 11, subsequently, the interlayer insulating film 8 is formed on the upper surface of the semiconductor layer 2 by the low pressure CVD method so as to cover the gate electrode 7. Then, the contact hole is formed on the interlayer insulating film 8 and the gate insulating film 6 in part (A) of FIG. 11 and the contact hole is formed in the interlayer insulating film 8 provided on the gate electrode 7 in part (B) of FIG. 11.

Figure 12:
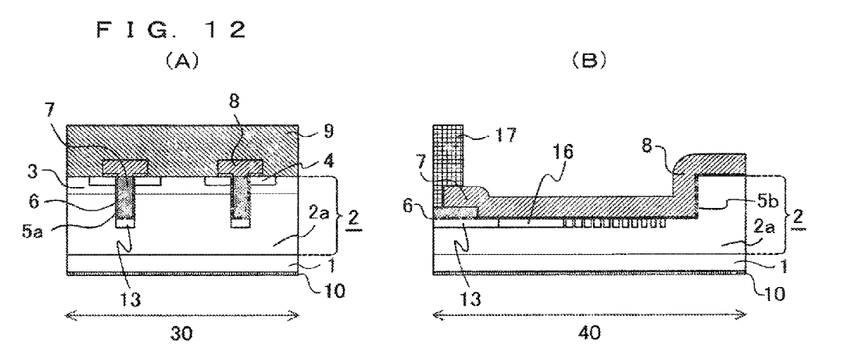

In part (A) of FIG. 12, thereafter, the source electrode 9 to be electrically connected to the source region 4 is formed in the contact hole formed on the interlayer insulating film 8 and on the interlayer insulating film 8. In part (B) of FIG. 12, moreover, a gate pad 17 to be electrically connected to the gate electrode 7 is formed in the contact hole formed on the interlayer insulating film 8 and on the interlayer insulating film 8. Finally, the drain electrode 10 is formed on the back surface of the silicon carbide substrate 1. Herein, materials forming the source electrode 9, the gate pad 17, and the drain electrode 10 can be properly selected from electrode materials such as Al, Cu, and Ni. Through the above steps, the silicon carbide semiconductor device 100 is finished.

The silicon carbide semiconductor device 100 according to the present embodiment has the structure described above so that the following advantages can be produced.

First of all, description will be given of problems of a trench gate type silicon carbide semiconductor device having a protective diffusion layer provided in a lower portion of a trench. In an OFF state of the silicon carbide semiconductor device, a drain voltage is a high voltage of 100 to 10000 V and is held in a depletion layer extended from the protective diffusion layer provided in the lower portion of the trench to a drift layer. In that case, an electric field concentrates in a bottom portion of the protective diffusion layer, particularly, a corner part of the bottom portion of the protective diffusion layer. When the electric field in the corner part exceeds an avalanche breakdown electric field of the drift layer, there is a fear that an avalanche breakdown might occur in the protective diffusion layer to cause a dielectric breakdown. Moreover, there is a fear that the gate insulating film might cause the dielectric breakdown because the electric field concentration occurs also over the gate insulating film in the corner part of the trench. In the case where the gate insulating film is sufficiently protected by the protective diffusion layer, however, the dielectric breakdown of the protective diffusion layer occurs earlier. For this reason, there is a fear that the withstand voltage of the semiconductor device might be limited by a voltage causing the avalanche breakdown (hereinafter, such a voltage will be referred to as an "avalanche voltage") in the protective diffusion layer.

In the case where a plurality of trenches is provided in the trench gate type semiconductor device, moreover, a protective diffusion layer is provided in a lower portion of each of the trenches. Consequently, an electric field generated in a corner part of the protective diffusion layer is relaxed by extension of a depletion layer from adjacent protective diffusion layers. However, an outermost peripheral protective diffusion layer out of the protective diffusion layers has the adjacent protective diffusion layer provided on only one side. For this reason, an electric field on the outermost peripheral protective diffusion layer is the highest. As a result, there is a fear that the avalanche breakdown might occur earlier in the outermost peripheral protective diffusion layer and the withstand voltage might be thus limited by the avalanche voltage in the outermost peripheral protective diffusion layer.

In the present embodiment, the termination trench 5b is formed in the termination region 40 being the surrounding region of the active region 30, and the termination diffusion layer 16 is formed in the lower portion of the termination trench 5b. Therefore, the termination diffusion layer 16 is present around the protective diffusion layer 13 formed in the lower portion of the trench 5a provided in the active region 30. For this reason, the termination diffusion layer 16 is also present at the outer peripheral side of the protective diffusion layer 13 formed on the outermost periphery. Therefore, electric potential distribution in the outermost peripheral protective diffusion layer 13, particularly, in the corner part of the outermost peripheral protective diffusion layer 13 is made smooth by the extension of the depletion layer from the termination diffusion layer 16. As a result, it is possible to relax an electric field to be applied to the corner part of the outermost peripheral protective diffusion layer 13.

If the second impurity concentration to be the impurity concentration of the termination diffusion layer 16 is equal to or higher than the first impurity concentration to be the impurity concentration of the protective diffusion layer 13, moreover, there is a fear that the electric field in the termination diffusion layer 16 might be higher than the electric field in the protective diffusion layer 13 and the withstand voltage might be thus limited by the avalanche voltage in the termination diffusion layer 16. In the present embodiment, the second impurity concentration is lower than the first impurity concentration. Therefore, the electric field generated in the termination diffusion layer 16 itself can also be reduced as compared with the electric field generated in the protective diffusion layer 13. Accordingly, it is possible to suppress the limitation of the withstand voltage of the semiconductor device by the avalanche voltage in the outermost peripheral protective diffusion layer 13 or the termination diffusion layer 16. Consequently, the withstand voltage of the silicon carbide semiconductor device 100 can be enhanced.

In the present embodiment, furthermore, the protective diffusion layer 13 is provided in the lower portion of the trench 5a. Therefore, it is possible to relax the electric field to be applied to the gate insulating film 6 in the trench 5a. On the other hand, even if the protective diffusion layer 13 is provided in the lower portion of the trench 5a, the electric field is applied to the gate insulating film 6 in the trench 5a when the protective diffusion layer 13 is completely depleted. Consequently, there is a fear that a breakdown might occur in the corner part of the gate insulating film 6.

Therefore, the impurity concentration of the protective diffusion layer 13 is set to be the impurity concentration in which the protective diffusion layer 13 is not depleted completely when the rated voltage of the silicon carbide semiconductor device 100 is applied between the drain electrode 10 and the source electrode 9. Consequently, the protective diffusion layer 13 is prevented from being depleted completely in the OFF state of the silicon carbide semiconductor device 100. Thus, the gate insulating film 6 can be protected reliably. More specifically, by setting the impurity concentration of the protective diffusion layer 13 to be equal to or higher than $5.0E17$ $cm^{-3}$ and to be equal to or lower than $5.0E18$ $cm^{-3}$, it is possible to reliably protect the gate insulating film 6.

When the impurity concentration of the protective diffusion layer 13 is gradually increased so as not to cause complete depletion as described above, then, the electric field generated in the protective diffusion layer 13 is raised. For this reason, there is a fear that the avalanche breakdown might occur in the protective diffusion layer 13 earlier than the breakdown of the gate insulating film 6. In particular, there is a fear that the avalanche breakdown might occur earlier in the outermost peripheral protective diffusion layer 13 than the other protective diffusion layers 13 as described above.

In the present embodiment, however, the termination diffusion layer 16 is provided. Therefore, the termination diffusion layer 16 is also formed around the outermost peripheral protective diffusion layer 13 so that the electric field generated in the outermost peripheral protective diffusion layer 13 can also be relaxed. Thus, it is possible to suppress the occurrence of the avalanche breakdown earlier than in the other protective diffusion layers 13. As described above, in the present embodiment, it is possible to reduce the electric field generated in the gate insulating film 6, the protective diffusion layer 13, and the termination diffusion layer 16. Therefore, it is possible to suppress both the dielectric breakdown of the gate insulating film 6 and the avalanche breakdowns in the protective diffusion layer 13 and the termination diffusion layer 16. Thus, the withstand voltage of the silicon carbide semiconductor device 100 can be enhanced.

Although the trench 5a is formed like a grid in the present embodiment, it may be formed like a shape of a comb or zigzag. Also in such a case, the termination trench 5b is formed around the trench 5a so that the electric field of the protective diffusion layer 13 can be relaxed by the termination diffusion layer 16 provided in the lower portion of the termination trench 5b.

Moreover, a plurality of small regions separated from each other is formed on the outer peripheral side of the termination diffusion layer 16. With this structure, the termination diffusion layer 16 also functions as a guard ring formed in the termination region 40 in a general semiconductor device. Therefore, the depletion layer is extended from the termination diffusion layer 16 toward the end of the semiconductor layer 2 in the termination region 40 so that the electric field in the termination region 40 can be relaxed. Moreover, the structure on the outer peripheral side of the termination diffusion layer 16 may be another termination structure such as a JTE (Junction Termination Extension) structure having such a gradation that the impurity concentration is gradually reduced toward the outer peripheral side.

Furthermore, the gate insulating film 6 is also formed in the termination trench 5b. Therefore, the electric field concentration occurs the corner part of the gate insulating film 6 in the termination trench 5b. However, the protective diffusion layer 13 is formed on the inner peripheral side (the active region 30 side) in the planar direction of the lower portion of the termination trench 5b. Consequently, it is possible to relax the electric field to be applied to the gate insulating film 6 in the termination trench 5b.

In the case where the electric field to be applied to the corner part of the gate insulating film 6 in the termination trench 5b is lower than the electric field to be applied to the corner part of the gate insulating film 6 in the trench 5a or the case where the insulating strength of the gate insulating film 6 to be formed in the termination trench 5b is sufficiently high, the protective diffusion layer 13 is not provided in the lower portion of the termination trench 5b but only the termination diffusion layer 16 may be provided over the entire surface of the lower portion of the termination trench 5b. In such a case, the electric field to be applied to the outermost peripheral protective diffusion layer 13 formed in the lower portion of the trench 5a is relaxed by the termination diffusion layer 16.

On the other hand, in the case where the protective diffusion layer 13 is provided in the lower portion of the termination trench 5b, the protective diffusion layer 13 formed in the lower portion of the termination trench 5b serves as the outermost peripheral protective diffusion layer 13. For this reason, the electric field to be applied to the outermost peripheral protective diffusion layer 13 out of the protective diffusion layers 13 formed in the lower portion of the trench 5a is relaxed by the protective diffusion layer 13 formed in the lower portion of the termination trench 5b. However, there is a fear that the avalanche breakdown might occur in the outermost peripheral protective diffusion layer 13 formed in the lower portion of the termination trench 5b. In the present embodiment, however, the electric field to be applied to the outermost peripheral protective diffusion layer 13 formed in the lower portion of the termination trench 5b is relaxed by the termination diffusion layer 16. Therefore, it is possible to prevent the withstand voltage from being limited by the avalanche voltage of the outermost peripheral protective diffusion layer 13 formed in the lower portion of the termination trench 5b.

Figure 13:
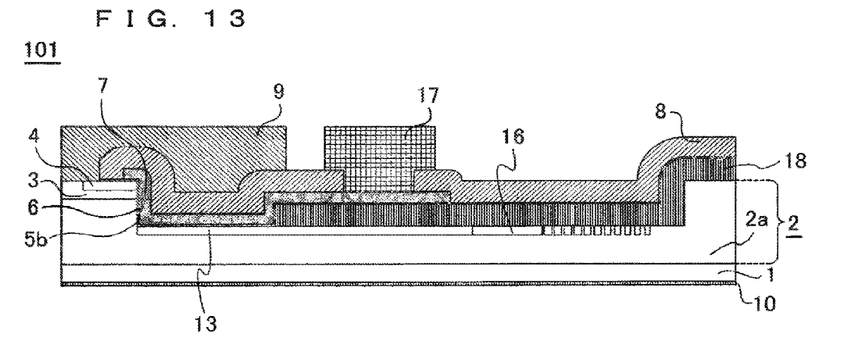
FIGS. 13 and 14 are sectional views showing the silicon carbide semiconductor device according to the first embodiment of the present invention.
Figure 14:
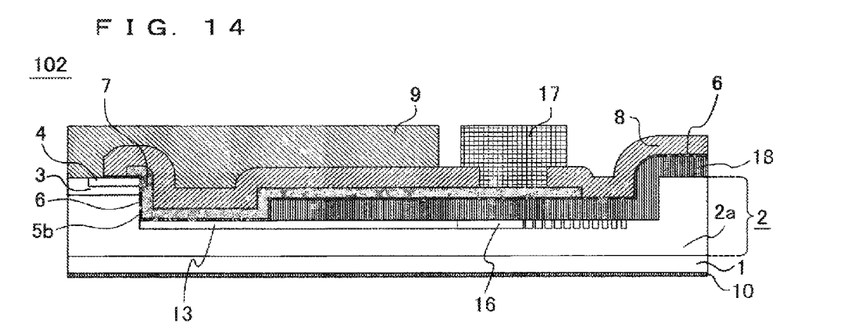

Furthermore, FIGS. 13 and 14 are sectional views showing a silicon carbide semiconductor device 101 and a silicon carbide semiconductor device 102, respectively, according to variants of the silicon carbide semiconductor device 100 in accordance with the present embodiment.

As shown in FIG. 13, in the present embodiment, a field insulating film 18 may be formed from a part of the bottom surface of the termination trench 5b toward the end of the semiconductor layer 2. The field insulating film 18 is formed between the gate insulating film 6 and the semiconductor layer 2 in such a manner that the gate electrode 7 formed in the termination trench 5b gets on the field insulating film 18. In more detail, the interlayer insulating film 8 is opened so that the gate pad 17 is formed from the inner peripheral side (the active region 30 side) of a connection region toward the outer peripheral side (the termination region 40 side). It is sufficient that the field insulating film 18 is formed by the low pressure CVD method, and the field insulating film 18 is formed to be thicker than the thickness of the gate insulating film 6. By providing the field insulating film 18 in this manner, it is possible to reduce a parasitic capacitance between a gate and a drain, thereby enabling a decrease in a switching loss.

As shown in FIG. 14, moreover, the gate electrode 7 may be formed to reach above the termination diffusion layer 16 so as to connect the gate pad 17 to the gate electrode 7 above the termination diffusion layer 16. With this structure, electric potential distribution is bent by the gate electrode 7 above the termination diffusion layer 16 and an electric field concentration point the termination diffusion layer 16 is dispersed. For this reason, the electric field distribution of the termination diffusion layer 16 can be made smooth so that the width of the termination region 40 can be reduced and the chip area of the silicon carbide semiconductor device 102 can be decreased more greatly.

In the present embodiment, there has been illustrated the MOSFET with the structure in which the drift layer 2a and the silicon carbide substrate 1 have the same conductivity type. However, the present invention can also be applied to an IGBT with a structure in which the drift layer 2a and the silicon carbide substrate 1 have different conductivity types. For example, if the silicon carbide substrate 1 is set to be a p-type semiconductor substrate for the structure shown in FIG. 2, the structure of the IGBT is obtained. In such a case, the source region 4 and the source electrode 9 in the MOSFET correspond to an emitter region and an emitter electrode in the IGBT respectively and the drain electrode 10 of the MOSFET corresponds to a collector electrode.

Second Embodiment

Figure 15:
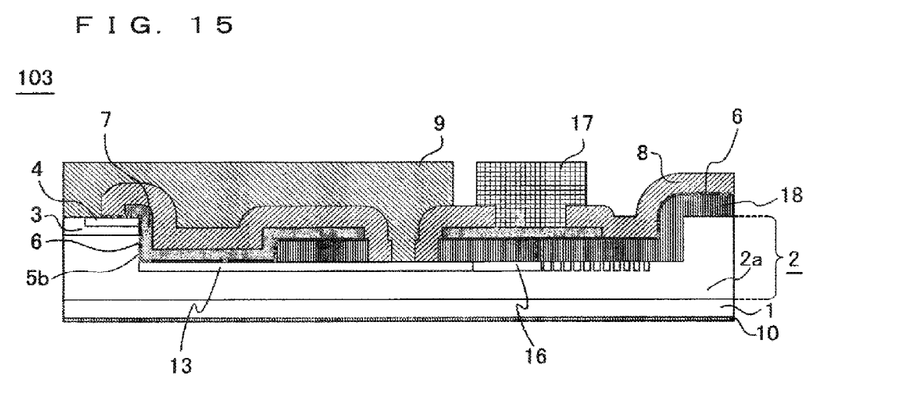
FIG. 15 is a sectional view showing a silicon, carbide semiconductor device according to a second embodiment of the present invention.

FIG. 15 is a sectional view showing a silicon carbide semiconductor device 103 according to a second embodiment. In FIG. 15, components having the same reference numerals and symbols as those in FIG. 14 indicate the same or corresponding structures. As compared with the structure shown in FIG. 14 according to the first embodiment, the present embodiment is different in that a source electrode 9 is connected to a protective diffusion layer 13 in a termination trench 5b. In the following description, accordingly, only differences from the first embodiment will be described and description of the same structures as those in the first embodiment will not be given.

As shown in FIG. 15, there is formed a contact hole penetrating a field insulating film 18, a gate electrode 7, and an interlayer insulating film 8 in the termination trench 5b. The source electrode 9 is connected to the protective diffusion layer 13 via the contact hole. Moreover, the interlayer insulating film 8 is also formed on a side surface of the contact hole in such a manner that the gate electrode 7 and the source electrode 9 are not connected to each other.

In the present embodiment, the following advantages can be produced by the structure described above. When the silicon carbide semiconductor device 103 performs a switching operation, an ON state and an OFF state are changed over in a switching cycle. Therefore, a carrier is diffused from the protective diffusion layer 13 so that a depletion layer spreads when the silicon carbide semiconductor device 103 is in the OFF state, and the diffused carrier is returned into an original condition when the silicon carbide semiconductor device 103 is in the ON state. If the return of the carrier is late when the silicon carbide semiconductor device 103 is brought into the ON state, there is a fear that a switching speed might be reduced correspondingly, resulting in an increase in a switching loss. In the present embodiment, however, the protective diffusion layer 13 having the depletion layer spreading is connected to the source electrode 9. Therefore, the carrier is returned to the protective diffusion layer 13 by a source potential of the source electrode 9 when the silicon carbide semiconductor device 103 is brought into the ON state. Thus, it is possible to suppress an increase in the switching loss.

In the same manner as the first embodiment, moreover, the electric field of the protective diffusion layer 13 can be relaxed by a termination diffusion layer 16 and a withstand voltage of the silicon carbide semiconductor device 103 can be thus enhanced.

Third Embodiment

Figure 16:
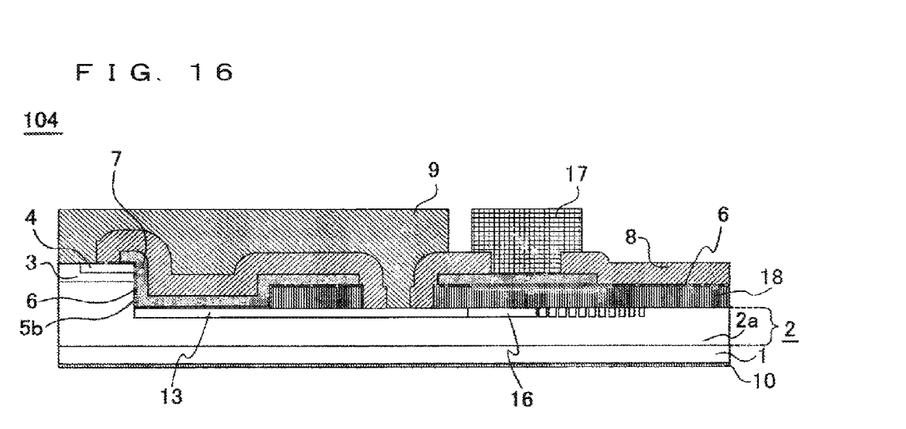
FIG. 16 is a sectional view showing a silicon carbide semiconductor device according to a third embodiment of the present invention.

FIG. 16 is a sectional view showing a silicon carbide semiconductor device 104 according to a third embodiment. In FIG. 16, components having the same reference numerals and symbols as those in FIG. 15 indicate the same or corresponding structures. As compared with the structure shown in FIG. 15 according to the second embodiment, the present embodiment is different in the structure of a termination trench 5b. In the following description, accordingly, only differences from the first embodiment will be described and description of the same structures as those in the first embodiment will not be given.

As shown in FIG. 16, the termination trench 5b is formed to reach to an end of a semiconductor layer 2. Consequently, the end of the semiconductor layer 2, that is, a chip end of the silicon carbide semiconductor device 104 has an equal height to heights of a trench 5a and the termination trench 5b.

In the present embodiment, the following advantages can be produced by the structure described above. The termination trench 5b is extended to the end of the semiconductor layer 2 so that a difference in level of the chip end of the silicon carbide semiconductor device 104 can be eliminated. Therefore, it is possible to reduce a process load. Moreover, there are eliminated corner parts on outer peripheral sides of a gate insulating film 6 and a field insulating film 18 to be formed in the termination trench 5b. Therefore, an electric field concentration does not occur in the corner parts and it is possible to suppress a fear that a dielectric breakdown might occur in the corner parts of the gate insulating film 6 and the field insulating film 18.

In the same manner as the first embodiment, moreover, the electric field of the protective diffusion layer 13 can be relaxed by a termination diffusion layer 16 and a withstand voltage of the silicon carbide semiconductor device 104 can be thus enhanced.

In the present invention, respective embodiments can be combined freely and can be properly changed and omitted without departing from the scope of the present invention.

The invention claimed is:

1. A silicon carbide semiconductor device comprising:
a drift layer of a first conductivity type that is located in a semiconductor layer and formed in an active region and a termination region being a surrounding region of said active region;
a base region of a second conductivity type formed on an upper portion of said drift layer in said active region;
a source region of the first conductivity type formed on an upper portion in said base region;
a source electrode connected to said source region;
an active trench formed in penetration through said source region and said base region in said active region;
a termination trench formed to surround said active trench in said drift layer of said termination region;
a gate insulating film formed on a bottom surface and a side surface of said active trench;
a gate electrode formed in said active trench with said gate insulating film interposed therebetween;
a protective diffusion layer of the second conductivity type formed in a lower portion of said active trench and a part of a lower portion of said termination trench and having a concentration of impurities of the second conductivity type which is a first impurity concentration; and
a termination diffusion layer of the second conductivity type formed on an outside of said protective diffusion layer in said lower portion of said termination trench and having a concentration of impurities of the second conductivity type which is a second impurity concentration lower than said first impurity concentration,
wherein said protective diffusion layer is connected to said source electrode in a contact region of said lower portion of said termination trench, and
said termination diffusion layer has a plurality of impurity regions of the second conductivity type that are located apart from said protective diffusion layer and have said second impurity concentration.

2. The silicon carbide semiconductor device according to claim 1, wherein a width of said termination trench is greater than a width of said active trench.

3. The silicon carbide semiconductor device according to claim 1, further comprising:

a drain electrode formed on a back surface side of said semiconductor layer,
wherein said first impurity concentration is an impurity concentration in which said protective diffusion layer is not depleted completely when a rated voltage of said silicon carbide semiconductor device is applied between said drain electrode and said source electrode.

4. The silicon carbide semiconductor device according to claim 1, wherein
said first impurity concentration is equal to or higher than $5.0E17$ cm$^{-3}$ and is equal to or lower than $5.0E18$ cm$^{-3}$, and
said second impurity concentration is equal to or higher than $1.0E17$ cm$^{-3}$ and is equal to or lower than $1.0E18$ cm$^{-3}$, and is lower than said first impurity concentration.

5. The silicon carbide semiconductor device according to claim 1, wherein said protective diffusion layer is further formed in a lower portion of said termination trench and at an inner peripheral side of said termination diffusion layer.

6. The silicon carbide semiconductor device according to claim 1, wherein said termination trench is extended to an end of said semiconductor layer.

7. The silicon carbide semiconductor device according to claim 1, wherein said gate electrode is connected to an electrode having a lower resistivity than said gate electrode over said termination trench.

8. A method for manufacturing a silicon carbide semiconductor device comprising:
preparing a semiconductor substrate having an active region and a termination region being a surrounding region of said active region and having a semiconductor layer of a first conductivity type formed of a silicon carbide semiconductor in said active region and said termination region;
forming a base region of a second conductivity type on an upper portion in said semiconductor layer in said active region;
forming a source region of the first conductivity type on an upper portion in said base region;
forming, by using a mask formed on an upper surface of said semiconductor layer, an active trench penetrating said source region and said base region in said active region and forming a termination trench to surround said active trench in said termination region;
implanting impurities into lower portions of said active trench and said termination trench respectively, thereby forming a protective diffusion layer of the second conductivity type having a concentration of impurities of the second conductivity type which is a first impurity concentration, and a termination diffusion layer of the second conductivity type having a concentration of impurities of the second conductivity type which is a second impurity concentration lower than said first impurity concentration; and
forming a source electrode connected to said source region,
wherein said protective diffusion layer is connected to said source electrode in a contact region of said lower portion of said termination trench, and
said termination diffusion layer is formed so as to have a plurality of impurity regions of the second conductivity type that are located apart from said protective diffusion layer and have said second impurity concentration.

* * * * *